United States Patent [19]
Short
[11] 3,770,496
[45] Nov. 6, 1973

[54] ELIMINATION OF DIELECTRIC DEGRADATION IN PRINTED BOLD/DIELECTRIC/PALLADIUM-SILVER STRUCTURES

[75] Inventor: Oliver A. Short, Wilmington, Del.

[73] Assignee: E. I. du Pont de Nemours and Company, Wilmington, Del.

[22] Filed: June 25, 1971

[21] Appl. No.: 156,992

[52] U.S. Cl. .................... 117/212, 117/71, 117/217
[51] Int. Cl. .................... H05k 1/02, B41m 3/08
[58] Field of Search .................... 117/212, 217, 71; 252/514; 29/625, 628; 75/165

[56] References Cited

UNITED STATES PATENTS

| | | | |
|---|---|---|---|
| 1,561,247 | 11/1925 | Kingsbury | 75/165 |
| 937,284 | 10/1909 | Craft et al. | 75/165 |
| 937,285 | 10/1909 | Craft et al. | 75/165 |
| 3,560,256 | 2/1971 | Abrams | 29/628 X |

*Primary Examiner*—Alfred L. Leavitt
*Attorney*—James A. Forstner

[57] ABSTRACT

In a method for printing multilayer electronic structures on a substrate which minimizes degradation at crossovers in structures which comprise a gold electrode, dielectric crossovers, and a silver or silver/palladium electrode, in that order, the incorporation of at least 20 percent by weight silver in the metallization used to print the gold electrode. Also provided are objects prepared by the above method.

6 Claims, No Drawings

ELIMINATION OF DIELECTRIC DEGRADATION IN PRINTED BOLD/DIELECTRIC/PALLADIUM-SILVER STRUCTURES

The invention relates to electronic devices, and, more particularly, to such devices fabricated by printing techniques.

Gold conductors are often used in electronic circuitry where circuits of high conductivity are required, although soldering is difficult. Palladium/silver and silver conductors are used where soldering (to improve conductivity or connection to outside leads) is desired. Often it is desirable to employ both gold conductors and inexpensive solderable silver or palladium/silver conductors on a single substrate. In such complex electronic circuits it is at times necessary for the two dissimilar conductors to cross over one another, with a printed dielectric layer between them.

When gold is the bottom conductor, a fired glass is the insulator, and silver or palladium/silver is the top conductor (each separately printed, and fired), at the overlap or crossover almost invariably the top conductor blisters and the dielectric layer crumbles. This results in circuit disruption and shorting. This degradation has been observed (1) regardless of the source and content of the glass binder used in the top and bottom metallizations, (2) with various compositions in the printed dielectric layer, and (3) with top conductors of silver or the typical Pd/Ag compositions, e.g., 2/1, 3/1, 4/1, each by weight. A solution to this problem of degradation is, therefore, needed.

SUMMARY OF THE INVENTION

This invention relates to a method of printing multilayer electronic structures on a substrate comprising the steps of (a) printing a first gold conductor pattern on the substrate and firing the same to form a conductor; (b) printing a dielectric layer with a glass powder over at least part of the gold conductor pattern to provide crossover positions over which subsequent conductor patterns may be printed, and optionally firing the same to form a dielectric; and then (c) printing a second conductor pattern comprising, by weight, 0–90 percent palladium and 10–100 percent silver, which second pattern crosses over the gold pattern only at said crossover positions where dielectric layer has been printed over the gold pattern, and then firing the same to form a conductor, or, where dielectric layer (b) was not prefired, cofiring layer (b) and pattern (c). In that method this invention provides the improvement of printing as said first pattern a gold metallization comprising at least 20 percent by weight silver, based on the total weight of gold and silver, whereby degradation of conductor patterns and dielectric layer at the crossover positions is minimized. It is preferred that the amount of silver, based on total metals in bottom metallization (a), be about 25 percent.

This invention also provides an electronic device comprising the following sequential coherent layers:

a. a dielectric substrate,
b. a gold conductor comprising at least 20 percent by weight silver, based on the total weight of gold and silver,
c. crossover dielectric layers, and
d. a second conductor comprising 0–90 percent palladium and 10–100 percent silver, pattern (d) crossing over pattern (b) only at dielectric layer (c).

DETAILED DESCRIPTION

In the bottom or gold conductor in the device of the present invention, and hence in the metallizing composition used to print the same in the method of the present invention, the minimum silver content according to this invention, based on the total weight of silver and gold, is 20 percent. Less silver leads to formation of blisters, quite striking even at 15 percent silver. About 25 percent silver is the preferred level, arrived at by balancing the desire to avoid such degradation and the desire to minimize conductor migration in humid atmospheres. Thus, as the silver content of the bottom metallization is increased, the tendency thereof to migrate increases approximately linearly. At 25 percent silver, the migration is insignificant. Thus, while there is no upper limit on the amount of silver in terms of achieving the effect of minimizing degradation, as a practical matter silver contents above 30 percent will not be preferred due to migration.

The metallizations used to print the lower and upper conductors in the method of the present invention comprise, in addition to conductive metals, glass frits as binders. Conventional glasses known to the art may be employed, in conventional quantities. Thus, glasses which form ceramics upon firing may be employed. Typical quantities of binder employed are less than 30 percent. The nature and amount of the metallization binder are not part of this invention.

The dielectric layer in the present invention is normally provided by printing a glass frit up to several mils thick, then firing the same to form a coherent layer. Conventional glasses which are fired to produce ceramics may be used, but preferred are the crystallizable glasses disclosed in Hoffman U.S. Ser. No. 717,410, filed Mar. 29, 1968, now U.S. Pat. No. 3,586,522.

The metallizations and dielectrics used are fine powders (at least fine enough to pass through a No. 325 screen, U. S. standard sieve scale, preferably a No. 400 screen) in successive layers. Each layer may be fired after being printed to form a coherent layer of dielectric or conductor. Alternately, the dielectric layer (or layers when two printings are used to produce a thick dielectric layer) and the top metallization may be cofired. Printing may be accomplished by known screen stencil techniques, and may be accomplished with or without vehicle; when vehicle is used, conventional quantities are employed. While not a part of this invention, vehicles which may be employed include water, inert organic liquids, etc.

EXAMPLES

The invention is illustrated by the following examples and comparative showings. Both below and elsewhere in the specification and claims, all parts, percentages and ratios are by weight. The thick film conductors and dielectrics in these examples were each printed through 200-mesh stencil screens.

Comparative Example 1

A gold conductor pattern was printed on an alumina substrate and fired at 940°C. for 10 minutes. The metallizing composition used contained 80 percent gold, 5 percent lead bisilicate frit (34% $SiO_2$, 65% PbO, 1% $Al_2O_3$) and 15 percent inert liquid vehicle. Over those parts of the fired gold pattern where crossovers are desired, there was printed a double layer of a dielectric composition containing 20% inert liquid vehicle and 80 percent of a frit (8% BaO, 11% $Al_2O_3$, 10% ZnO, 32% PbO, 27% $SiO_2$ and 12% $TiO_2$). The dielectric was fired at 890°C. for 10 minutes. A top conductor pattern (Pd/Ag) was printed on the substrate crossing the gold pattern at the dielectric areas, and then fired at 820°C. for 10 minutes; the metallization contained 22% Pd, 40% Ag, 2 1/4 percent cadmium borosilicate frit, 9% $Bi_2O_3$, and the balance inert liquid vehicle.

Blisters had developed during firing, in the crossover areas; short circuiting was observed. The blister was then probed with a sharp stylus under microscopic examination, revealing complete degradation of the dielectric layer.

Comparative Example 2

Repetition of Example 1 with top conductors of (a) gold, (b) 15 parts Pt/55 parts Au, or (c) 15 parts Pd/55 parts Au did not result in blistering, while a top conductor of (d) silver resulted in severe blistering and dielectric layer degradation.

Example 3

Repetition of Example 1 using as the bottom conductor several silver/gold mixtures as set forth below showed increasing improvement in the condition of the crossover structure (reduced blistering and dielectric degradation) as the silver content was increased. At 20 percent silver crossover degradation had been reduced to the trace level.

| Metal content of bottom conductor % | | Condition at crossover |
|---|---|---|
| Ag | Au | |
| 5.9 | 94.1 | Blistering; dielectric spongy |
| 11.1 | 89.9 | No blistering; dielectric degradation |
| 20 | 80 | Only a trace of dielectric degradation |
| 25 | 75 | No degradation observed |

I claim:

1. In a method of printing multilayer electronic structures on a substrate comprising the steps of (a) printing a first gold conductor pattern on the substrate and firing the same to form a conductor; (b) printing a dielectric layer with a glass powder over at least part of the gold conductor pattern to provide crossover positions over which subsequent conductor patterns may be printed; and then (c) printing a second conductor pattern comprising, by weight of total metals, 0–9 percent palladium and 10–100 percent silver, which second pattern crosses over the gold pattern only at said crossover positions where dielectric layer has been printed over the gold pattern, and then firing the resultant structure; the improvement of printing as said first pattern a gold metallization comprising at least 20 percent by weight silver, based on the total weight of gold and silver, whereby degradation of conductor patterns and dielectric layer at the crossover positions is minimized.

2. A process according to claim 1 wherein there is about 25 percent by weight silver in said first pattern metallization (a).

3. A process according to claim 1 wherein dielectric layer (b) is fired prior to printing of conductor pattern (c).

4. A process according to claim 3 wherein there is about 25 percent by weight silver in said first pattern metallization (a).

5. An electronic device comprising the following sequential coherent layers:

a. a dielectric substrate,
b. a gold conductor comprising at least 20 percent by weight silver, based on the total weight of gold and silver,
c. crossover dielectric layers, and
d. a second conductor comprising 0–90 percent palladium and 10–100 percent silver, pattern (d) crossing over pattern (b) only at dielectric layer (c).

6. A device according to claim 5 wherein (b) comprises about 25 percent silver.

* * * * *

PO-1050
(5/69)

UNITED STATES PATENT OFFICE
CERTIFICATE OF CORRECTION

Patent No. 3,770,496 Dated November 6, 1973

Inventor(s) Oliver A. Short

It is certified that error appears in the above-identified patent and that said Letters Patent are hereby corrected as shown below:

In the Title

Correct "Bold" to -- Gold -- .

In the Claims

Claim 1, column 4, line 8, correct "9" to -- 90 -- .

Signed and sealed this 9th day of April 1974.

(SEAL)
Attest:

EDWARD M.FLETCHER,JR.
Attesting Officer

C. MARSHALL DANN
Commissioner of Patents